(12) United States Patent
Park et al.

(10) Patent No.: US 8,928,564 B2
(45) Date of Patent: Jan. 6, 2015

(54) PIXEL CIRCUIT OF A FLAT PANEL DISPLAY DEVICE AND METHOD OF DRIVING THE SAME

(75) Inventors: Dong-Wook Park, Yongin (KR); Ki-Ju Im, Yongin (KR); Ki-Wook Kim, Yongin (KR); Yeon-Gon Mo, Yongin (KR); Hui-Won Yang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 563 days.

(21) Appl. No.: 12/944,641

(22) Filed: Nov. 11, 2010

(65) Prior Publication Data

US 2011/0273419 A1 Nov. 10, 2011

(30) Foreign Application Priority Data

May 10, 2010 (KR) .................. 10-2010-0043503

(51) Int. Cl.
*G09G 3/30* (2006.01)
*G09G 5/00* (2006.01)

(52) U.S. Cl.
CPC ... *G09G 3/30* (2013.01); *G09G 5/00* (2013.01)
USPC .............................. 345/77; 345/76

(58) Field of Classification Search
USPC .............................. 345/76, 77, 82
See application file for complete search history.

(56) References Cited

U.S. PATENT DOCUMENTS

| 7,652,291 B2 * | 1/2010 | Koo et al. ................ 257/72 |
| 7,696,513 B2 * | 4/2010 | Hayashi et al. ............. 257/43 |

(Continued)

FOREIGN PATENT DOCUMENTS

| JP | 2004-273614 | 9/2004 |
| JP | 2009-099778 | 5/2009 |

(Continued)

OTHER PUBLICATIONS

Korean Office Action dated Sep. 16, 2011, issued in corresponding Application Serial No. 10-2010-0043503 (4 sheets).

(Continued)

*Primary Examiner* — Adam J Snyder
*Assistant Examiner* — Roy Rabindranath
(74) *Attorney, Agent, or Firm* — Christie, Parker & Hale, LLP

(57) ABSTRACT

A pixel circuit of a flat panel display device and a method for driving thereof are provided. The pixel circuit includes a first transistor having a first gate electrode coupled to a scan line, a second electrode coupled to a data line, a second gate electrode coupled to a controlling signal line, and a first electrode, a second transistor having a first gate electrode coupled to the first electrode of the first transistor, a second electrode coupled to a first voltage source, a second gate electrode coupled to the controlling signal line, and a first electrode, a capacitor coupled between the first gate electrode of the second transistor and the first electrode of the second transistor, and an organic light emitting diode coupled between the first electrode of the second transistor and a second voltage source, in which the threshold voltage of the first and second transistors may be controlled to the required level by supplying a controlling signal of a fixed voltage level to the second gate electrodes of the first and second transistors through the controlling signal line.

9 Claims, 4 Drawing Sheets

(56) References Cited

U.S. PATENT DOCUMENTS

| | | | |
|---|---|---|---|
| 8,284,135 B2* | 10/2012 | Minami et al. | 345/82 |
| 8,334,826 B2* | 12/2012 | Min et al. | 345/82 |
| 2005/0012471 A1* | 1/2005 | Burau et al. | 315/291 |
| 2006/0061526 A1* | 3/2006 | Shirasaki et al. | 345/77 |
| 2006/0066512 A1* | 3/2006 | Afentakis et al. | 345/55 |
| 2006/0208971 A1* | 9/2006 | Deane | 345/76 |
| 2008/0001854 A1* | 1/2008 | Hamer et al. | 345/76 |
| 2008/0272992 A1* | 11/2008 | Kwak | 345/76 |
| 2009/0213039 A1* | 8/2009 | Ito | 345/30 |

FOREIGN PATENT DOCUMENTS

| | | |
|---|---|---|
| KR | 10-2002-0002516 | 1/2002 |
| KR | 10-2009-0084642 | 8/2009 |
| KR | 10-2009-0120093 | 11/2009 |

OTHER PUBLICATIONS

KIPO Office action dated Apr. 26, 2012, for Korean priority application 10-2010-0043503, (1 page).

* cited by examiner

# PIXEL CIRCUIT OF A FLAT PANEL DISPLAY DEVICE AND METHOD OF DRIVING THE SAME

CROSS-REFERENCE TO RELATED APPLICATIONS

This application claims priority to and the benefit of Korean Patent Application No. 10-2010-0043503, filed on May 10, 2010, in the Korean Intellectual Property Office, the entire content of which is incorporated herein by reference.

BACKGROUND

1. Field

One or more embodiments of the present invention relate to a pixel circuit of a flat panel display device and a method of driving the same.

2. Description of Related Art

The thin-film transistor is composed of an active layer including a channel region, a source region, and a drain region, and a gate electrode that is overlapped with the channel region, and is insulated from the active region by a gate insulating layer.

The active layer of the thin-film transistor is generally made of a semiconductor material, such as amorphous silicon or a poly-silicon. However, when the active layer is made of amorphous silicon, mobility becomes low, so that the implementation of a driving circuit operated at a high speed is difficult. In addition, when the active layer is made of a poly-silicon, mobility becomes high, but threshold voltage is not uniform, so that a special compensating circuit should be added.

In addition, a method for manufacturing an existing thin-film transistor by using low temperature poly-silicon (LTPS) includes a process having high cost, such as laser thermal treatment, and it is difficult to control properties, making an application to a large size substrate difficult.

In order to solve the problems mentioned above, research using an oxide semiconductor as the active layer has been proceeding.

Japanese Laid Open Patent Application No. JP-A-2004-273614 discloses a thin-film transistor including as an active layer an oxide semiconductor that is composed of zinc oxide (ZnO) as a main material.

An oxide semiconductor composed of ZnO as a main material is considered as a stable material while being in an amorphous state. When using the oxide semiconductor as the active layer, the thin-film transistor may be manufactured at a low temperature by using the existing devices without purchasing a special additional device. Also, ion injection process may be omitted.

However, such devices may result in low reliability because electrical properties of the thin-film transistor having the oxide semiconductor as the active layer (hereinafter, referred to as "oxide thin-film transistor") may be changed according to its configuration and processing condition. For example, when driving a constant-voltage or constant-current, deteriorating current properties and changes in threshold voltage can deteriorate electrical properties.

Therefore, when the pixel circuit or driving circuit of the flat panel display device, such as a liquid crystal display device or an organic light emitting display device, is formed using oxide thin-film transistors, image quality and performance may be deteriorated by non-uniform threshold voltages.

SUMMARY

An aspect of embodiments according to the present invention provides a pixel circuit of a flat panel display device that can constantly maintain a threshold voltage of an oxide thin-film transistor, and a method for driving the same.

Another aspect of embodiments according to the present invention provides a pixel circuit of a flat panel display device that can prevent or reduce image quality and performance deterioration, and a method for driving the same.

In order to achieve the foregoing and/or other aspects of the present invention, according to one embodiment of the present invention, there is provided a pixel circuit of the flat panel display device including: a first transistor having a first gate electrode coupled to a scan line, a second electrode coupled to a data line, a second gate electrode coupled to a controlling signal line, and a first electrode; a second transistor having a first gate electrode coupled to the first electrode of the first transistor, a second electrode coupled to a first voltage source, a second gate electrode coupled to the controlling signal line, and a first electrode; a capacitor coupled between the first gate electrode of the second transistor and the first electrode of the second transistor; and an organic light emitting diode coupled between the first electrode of the second transistor and a second voltage source.

Each of the first and second transistors may further include a substrate on which the first gate electrode is located, a first insulating layer on the first gate electrode, an active layer including an oxide semiconductor on the first insulating layer and over the first gate electrode, and a second insulating layer on the active layer, wherein the first electrode and the second electrode are on the second insulating layer and coupled with the active layer, and wherein the second gate electrode is on the second insulating layer and is located between the first electrode and the second electrode.

The first electrode and the second electrode may be coupled to the active layer through respective contact holes in the second insulating layer.

The second gate electrode may be overlapped with the first gate electrode.

The oxide semiconductor may include ZnO.

The oxide semiconductor may be doped with at least one ion of Ga, In, Sn, Zr, Hf, or V.

Threshold voltages of the first transistor and the second transistor may be controlled by a voltage level of a controlling signal supplied to the controlling signal line.

In order to achieve the foregoing purposes and/or other aspects of the present invention, according to another embodiment of the present invention, there is provided a pixel circuit of the flat panel display device including: a first transistor having a first gate electrode coupled to a scan line, a second electrode coupled to a data line, a second gate electrode coupled to a second controlling signal line, and a first electrode; a second transistor having a first electrode, a second gate electrode coupled to the second controlling signal line, and a first gate electrode coupled to the first electrode of the first transistor; a third transistor having a first gate electrode coupled to a first controlling signal line, a second electrode coupled to a first voltage source, a second gate electrode coupled to the second controlling signal line, and a first electrode coupled to the second transistor; a capacitor coupled between the first gate electrode of the second transistor and the first electrode of the second transistor; and an organic light emitting diode coupled between the first electrode of the second transistor and a second voltage source.

Each of the first transistor, the second transistor, and the third transistor may further include a substrate on which the first gate electrode is located, a first insulating layer on the first gate electrode, an active layer including an oxide semiconductor on the first insulating layer and over the first gate electrode, and a second insulating layer on the active layer, wherein the first electrode and the second electrode are on the second insulating layer and coupled with the active layer, and wherein the second gate electrode is on the second insulating layer and is located between the first electrode and the second electrode.

The first electrode and the second electrode may be coupled to the active layer through respective contact holes in the second insulating layer.

The second gate electrode may be overlapped with the first gate electrode.

The oxide semiconductor may include ZnO.

The oxide semiconductor may be doped with at least one ion of Ga, In, Sn, Zr, Hf, or V.

An emitting time of the organic light emitting diode may be controlled by a controlling signal supplied to the first controlling signal line.

Threshold voltages of the first transistor, the second transistor, and the third transistor may be controlled by a voltage level of the controlling signal supplied to the second controlling signal line.

In order to achieve the foregoing purposes and/or other aspects of the present invention, according to another embodiment of the present invention, there is provided a flat panel display device including: a transistor having a first gate electrode coupled to a scan line, a second electrode coupled to a data line, a first electrode, and a second gate electrode coupled to a controlling signal line; a capacitor coupled between the first electrode of the transistor and a voltage source; and a liquid crystal display panel element coupled to the capacitor in parallel.

The transistor may further include a substrate on which the first gate electrode is located, a first insulating layer on the first gate electrode, an active layer including an oxide semiconductor on the first insulating layer and over the first gate electrode, and a second insulating layer on the active layer, wherein the first electrode and the second electrode are on the second insulating layer and coupled with the active layer, and wherein the second gate electrode is on the second insulating layer and is located between the first electrode and the second electrode.

The first electrode and the second electrode may be coupled to the active layer through respective contact holes in the second insulating layer.

The second gate electrode may be overlapped with the first gate electrode.

The oxide semiconductor may include ZnO.

The oxide semiconductor may be doped with at least one ion of Ga, In, Sn,

Zr, Hf, or V.

A threshold voltage of the transistor may be controlled by a voltage level of a controlling signal supplied to the controlling signal line.

In order to achieve the foregoing purposes and/or other aspects of the present invention, according to another embodiment of the present invention, there is provided a flat panel display device including a plurality of pixels, each pixel of the plurality of pixels including: a first transistor having a first gate electrode coupled to a scan line, a second electrode coupled to a data line, a second gate electrode coupled to a controlling signal line, and a first electrode; a second transistor having a first gate electrode coupled to the first electrode of the first transistor, a second electrode coupled to a first voltage source, a second gate electrode coupled to the con-trolling signal line, and a first electrode; a capacitor coupled between the first gate electrode of the second transistor and the first electrode of the second transistor; and an organic light emitting diode coupled between the first electrode of the second transistor and a second voltage source.

In addition, in order to achieve the foregoing purposes and/or other aspects of the present invention, according to another embodiment of the present invention, there is provided a method for driving the pixel circuit of the flat panel display device including transmitting a data voltage from a second electrode of a first transistor to a first electrode of the first transistor in response to a scan signal applied to a first gate electrode of the first transistor, charging a capacitor with the data voltage, driving current corresponding to the data voltage according to a charged potential of the capacitor applied to the first gate electrode of a second transistor, thereby emitting light from an organic light emitting diode using the current corresponding to the data voltage, and controlling threshold voltages of the first transistor and the second transistor by supplying a controlling signal to second gate electrodes of the first transistor and the second transistor, The threshold voltages of the first transistor and the second transistor may be controlled by a voltage level of the controlling signal.

The method for driving the pixel circuit of the flat panel display device may further include measuring at least one of the threshold voltages of the first transistor and the second transistor, and producing the controlling signal having a voltage level corresponding to a changed degree of the at least one of the threshold voltages as indicated by the measured at least one of the threshold voltages.

Controlling the threshold voltages of the first transistor and the second transistor by supplying the controlling signal may be performed according to a used time of the display device or when the display device is turned on.

A pixel circuit of a flat panel display device according to the embodiments of the present invention may include an oxide thin-film transistor having a double-gate structure. Because channels at both sides of the active layer have a bias voltage supplied to two gates disposed on respective sides of the active layer, current properties can be improved as compared with that of the existing thin-film transistor, and the threshold voltage may be controlled to the required level by controlling the bias voltage level.

In an oxide thin-film transistor, the threshold voltage may be changed with the passing of time or the condition of the process (e.g., operation of the transistor). With the change of the threshold voltage, or with a voltage table formed through fixed experiments, the threshold voltage may be controlled at the required level by supplying a controlling signal of fixed voltage level to the controlling signal line coupled to one gate. The threshold voltage may be constantly maintained and constant current may flow through a luminous element, so that a high-gradation expression may be achieved, and deteriorations of image quality and performance may be reduced or prevented.

BRIEF DESCRIPTION OF THE DRAWINGS

The accompanying drawings, together with the specification, illustrate exemplary embodiments of the present invention, and, together with the description, serve to explain the principles of embodiments of the present invention.

DETAILED DESCRIPTION

Figure 1:
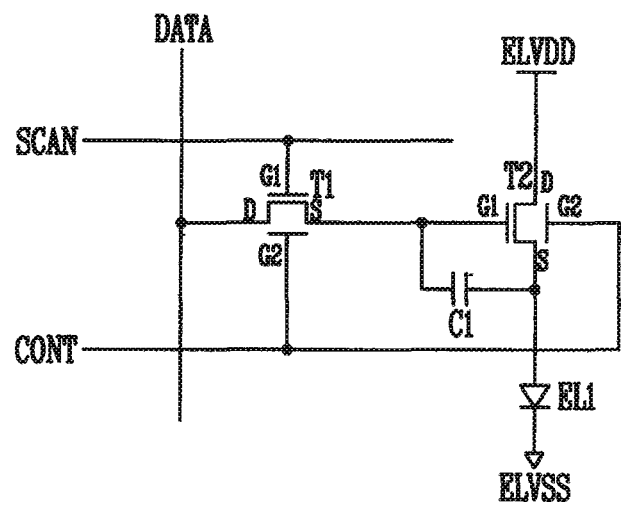
FIG. 1 is a circuit diagram illustrating a pixel circuit of a flat panel display device according to one embodiment of the present invention.

Hereinafter, certain exemplary embodiments according to the present invention will be described with reference to the accompanying drawings. Here, when a first element is described as being coupled to a second element, the first element may be directly coupled to the second element or may be indirectly coupled to the second element via one or more other elements. Further, some of the elements that are not essential to a complete understanding of the invention are omitted for clarity. Also, like reference numerals refer to like elements throughout.

Hereinafter, exemplary embodiments of the present invention are described in detail with reference to FIGS. 1-7. The following examples may be supplied for a complete understanding of the embodiments of the present invention by a person who has a general knowledge in the field of the technology, and can be modified to various types, and the scope of the embodiments of the present invention will not be limited to the following examples.

FIG. 1 is a circuit diagram illustrating a pixel circuit of a flat panel display device according to one embodiment of the present invention. The circuit diagram shows an example of a pixel circuit of an organic light emitting display device.

In an organic light emitting display device, pixels including organic light emitting diodes are at crossing regions between a plurality of scan lines and a plurality of data lines in a matrix format. The pixel circuit driving a pixel includes a switching transistor (e.g., T1) for transmitting a data signal, a driving transistor (e.g., T2) for driving the organic light emitting diode according to the data signal, and a capacitor (e.g., C1) for maintaining a data voltage (e.g., a voltage corresponding to the data signal).

Referring to FIG. 1, with respect to the first transistor T1, a first gate (e.g., a first gate electrode) G1 is coupled to a scan line SCAN, and a drain (e.g., a drain electrode) D is coupled to a data line DATA. With respect to the second transistor T2, a first gate G1 is coupled to a source (e.g., a source electrode) S of the first transistor T1, and a drain D is coupled to a first voltage source ELVDD. A capacitor C1 is coupled between a source S and the first gate G1 of the second transistor T2, and an organic light emitting diode EU is coupled between a second voltage source ELVSS and the source S of the second transistor T2. Second gates G2 of the first and second transistor T1 and T2 are coupled to a controlling signal line CONT. The first and second transistors T1 and T2 are each an aforementioned oxide thin-film transistor having the double-gate structure.

Figure 2:
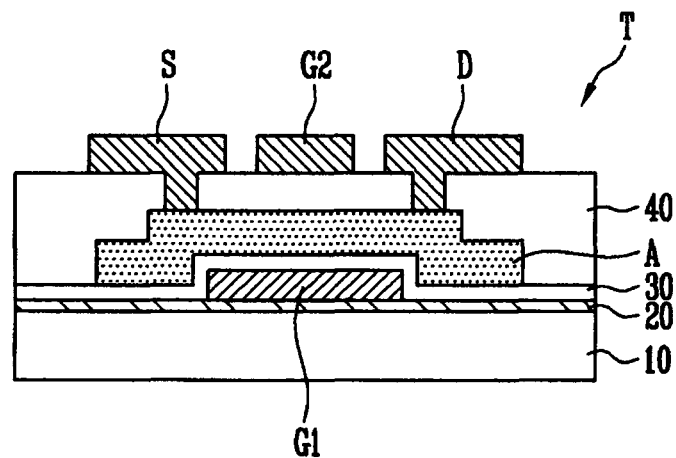
FIG. 2 is a cross-sectional view illustrating an oxide thin-film transistor having a double-gate structure according to one embodiment of the present invention.

FIG. 2 is a cross-sectional view illustrating an oxide thin-film transistor (e.g., the first or second transistor T1 or T2 of the embodiment of the present invention shown in FIG. 1) having a double-gate structure according to one embodiment of the present invention.

Referring to FIG. 2, the oxide thin-film transistor T having the double-gate structure includes a first gate G1, an active layer A insulated from the first gate G1 by a first insulating layer 30, a second gate G2 insulated from the active layer A by a second insulating layer 40, and a source S and a drain D coupled to the active layer A at a source region and a drain region, respectively.

A buffer layer 20 is formed on a substrate 10, and the first gate G1 is formed on the buffer layer 20. The first insulating layer 30 is formed on the buffer layer 20 and the first gate G1, and the active layer A of the oxide semiconductor is formed on the first insulating layer 30 over the first gate G1 (e.g., over the first gate G1 with the first insulating layer 30 interposed therebetween). The active layer A includes a channel region, the source region, and the drain region, and is positioned such that the channel region overlaps the first gate G1. The oxide semiconductor can be made of ZnO, and ZnO can be doped with at least one ion of Ga, In, Sn, Zr, Hf, or V.

In addition, the second insulating layer 40 is formed over a region including the active layer A. The source S and the drain D are coupled to the source region and the drain region of the active layer A, respectively, and the second gate G2 is located between the source S and the drain D, each of which is formed on the second insulating layer 40. The source S and the drain D are respectively coupled to the source region and the drain region of the active layer A through contact holes formed in the second insulating layer 40, and are located at a fixed distance from the second gate G2. The second gate G2 may overlap with the first gate G1 in whole or in part.

For the existing thin-film transistor including a single gate, the channel is formed on one side of the active layer close to the gate when bias voltage is supplied to the gate. However, for the oxide thin-film transistor T according to embodiments of the present invention, the channels are formed on both sides of the active layer A close to the first gate G1 and the second gate G2, respectively, so that current properties (e.g., on current properties) can be improved over that of the existing thin-film transistor.

Figure 3:
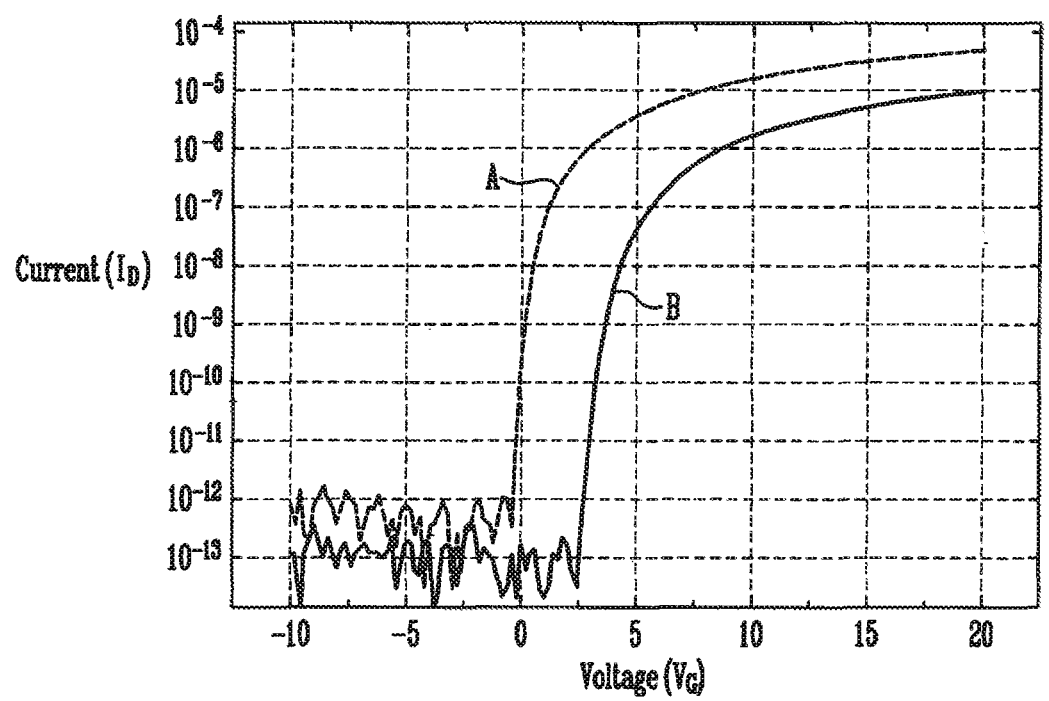
FIG. 3 is a graph showing a transfer curve of a drain current ($I_D$) according to a gate voltage ($V_G$)

FIG. 3 is a graph illustrating a transfer curve (e.g., a characteristic curve) of a drain current ($I_D$) according to a gate voltage ($V_G$) applied to the first gate G1. It is measured that the oxide thin-film transistor of embodiments of the present invention (solid line B) has an improved threshold voltage as compared to the existing thin-film transistor (dotted line A). In addition, the threshold voltage may be controlled to the required level by controlling the bias voltage (e.g., the voltage applied on CONT of FIG. 1) applied to the second gate G2.

Therefore, referring to FIG. 1, a pixel circuit of one embodiment of the present invention is driven as follows.

A scan signal is supplied through the selected scan line SCAN, and a data voltage (e.g., a voltage corresponding to a data signal) is supplied through the data line DATA, so that the first transistor T1 transmits the data voltage from the drain D to the source S according to the scan signal applied to the first gate G1. The capacitor C1 is charged by the data voltage, and the second transistor T2 drives the current corresponding to the data voltage and a charging potential of the capacitor C1 applied to the first gate G1. The organic light emitting diode EL1 emits light corresponding to current, which corresponds to the data voltage.

The threshold voltages of the first and second transistors T1 and T2 are changed by those processes so that the controlling signal is supplied to the second gate G2 of the first and second transistors T1 and T2 through the controlling signal line CONT. The controlling signal is supplied according to a changed degree of the threshold voltage, a passage of time, and/or a voltage table provided from fixed experiments. The threshold voltages of the first and second transistors T1 and T2 may be controlled to the required level by supplying the controlling signal having a fixed voltage level to the second gates G2 of the first and second transistors T1 and T2 through the controlling signal line CONT. Therefore, the threshold voltages of the first and second transistors T1 and T2 are constantly maintained, and constant current then flows through the organic light emitting diode EL1 so that the high-gradation expression may be achieved and deteriorations of image quality and performance can be reduced or prevented.

Figure 4:
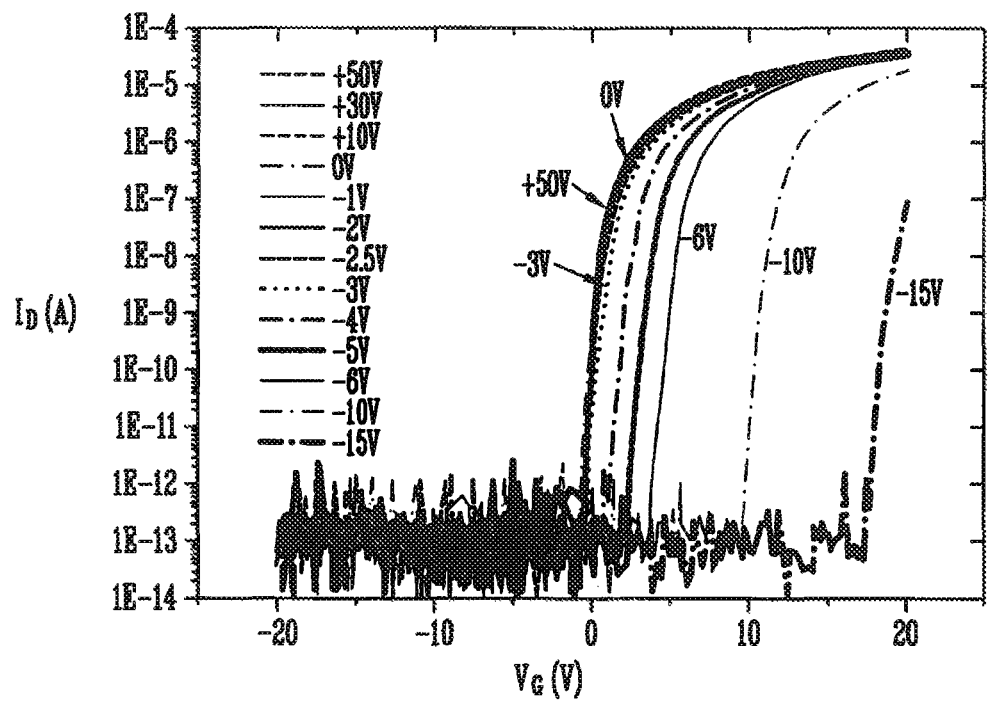
FIG. 4 is a graph showing a transfer curve of a threshold voltage according to a voltage level of a controlling signal supplied to a second gate.

FIG. 4 is a graph showing a transfer curve (e.g., a characteristic curve) of a threshold voltage according to a voltage level of a controlling signal applied to a second gate G2 (e.g., drain current $I_D$ vs. threshold voltage $V_G$ for different controlling signal voltages applied to a second gate G2). For example, it is shown that the threshold voltage is changed to a positive (+) voltage by changing the controlling signal of the second gate G2 from +50V to −15V.

For example, when the voltage level of the controlling signal applied to the second gate G2 is −10V, the threshold voltage becomes about +10V. Therefore, the threshold voltage can be controlled to the required level based on the result as mentioned above.

For example, if the threshold voltage is a negative (−) fixed voltage as the measured threshold voltage (e.g., the result that is measured of the threshold voltage) after manufacturing the display device, the threshold voltage can be controlled to a positive (+) voltage by supplying the controlling signal having a negative (−) fixed voltage to the second gate G2.

In addition, for example, the threshold voltage can be controlled to the required level by measuring the threshold voltage according to the amount of use of the display device (e.g., the amount of time the display device has been used), and applying to the second gate G2 the controlling signal of the voltage level corresponding to the changed degree of the threshold voltage according to the result measured.

In addition, and for example, the threshold voltage can be controlled to the required level by measuring the threshold voltage whenever switching on the display device, i.e., turning on the display device, and applying the controlling signal of the voltage level corresponding to the changed degree of the threshold voltage according to the result measured, to the second gate G2.

As one example of producing the controlling signal of the voltage level corresponding to the changed degree of the threshold voltage, the threshold voltage having the required level is first supplied to the first gate G1, and then the current value $I_D$ flowing through the drain D is detected. In this case, when detecting the current value $I_D$ having at least a certain level or more, the threshold voltage is changed to a negative (−) voltage so that the controlling signal having a negative (−) fixed voltage (for example −1V) is supplied to the second gate G2. That process is repeated until the current value $I_D$ flowing through the drain D becomes less than the certain level.

The embodiments of the present invention that produce the controlling signal and control the threshold voltage are for helping the understanding of the present invention. It can be, of course, performed variously within the scope of the technology of the embodiments of the present invention for controlling the threshold voltage to the required level by controlling the voltage level of the controlling signal according to the detected results of the threshold voltage. For example, other methods for controlling the threshold voltage may be performed within the scope of the embodiments of the present invention, as those skilled in the art would appreciate.

Figure 5:
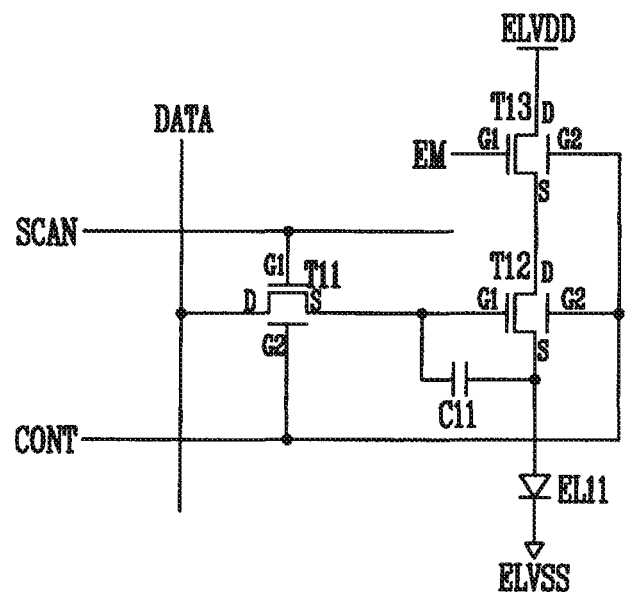
FIGS. 5, 6, and 7 are circuit diagrams illustrating pixel circuits of flat panel display devices according to other embodiments of the present invention.
Figure 6:
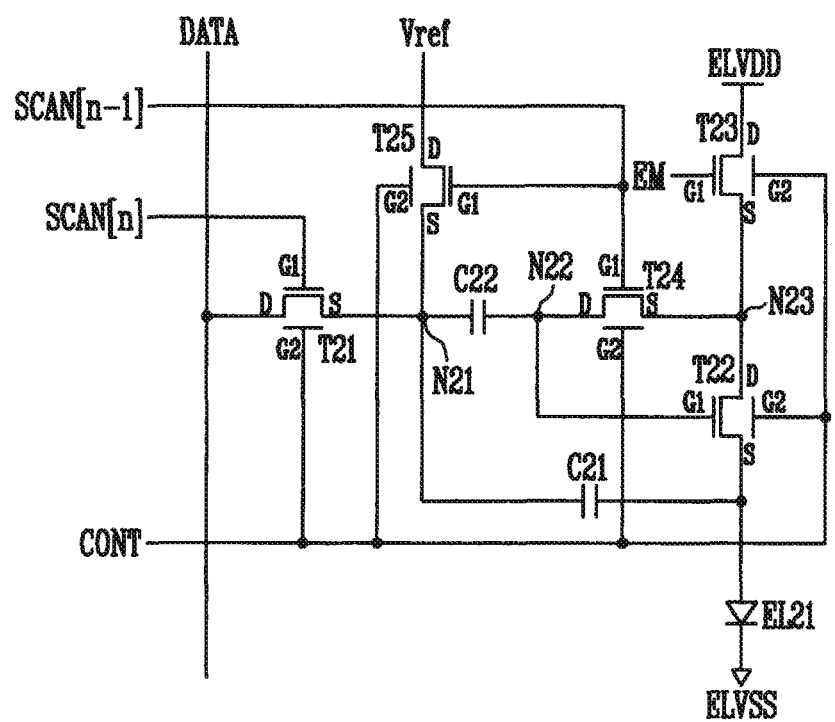
Figure 7:
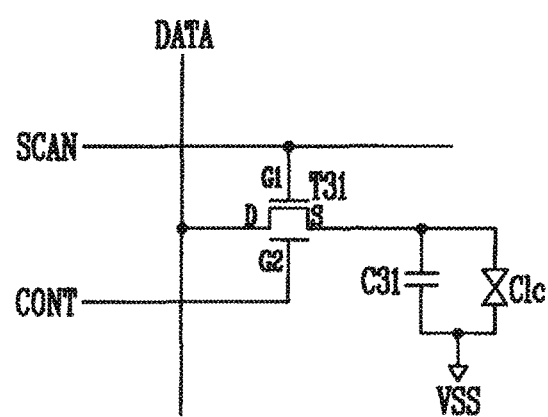

FIGS. 5, 6, and 7 are circuit diagrams illustrating pixel circuits of flat panel display devices according to other embodiments of the present invention. The figures show a pixel circuit of other embodiments of the present invention applied to the organic light emitting display device.

Referring to FIG. 5, with respect to a first transistor T11, a first gate G1 is coupled to a scan line SCAN, and a drain D is coupled to a data line DATA. With respect to a second transistor T12, a first gate G1 is coupled to a source S of the first transistor T11. With respect to a third transistor T13, a first gate G1 is coupled to a first controlling signal line EM, a drain D is coupled to a first voltage source ELVDD, and a source S is coupled to a drain D of the second transistor T12. A capacitor C11 is coupled between a source S and the first gate G1 of the second transistor T12, and an organic light emitting diode EL11 is coupled between a second voltage source ELVSS and the source of the second transistor T12. The second gates G2 of the first, second, and third transistors, T11, T12, and T13, are coupled to a second controlling signal line CONT.

The first, second, and third transistors T11, T12, and T13 are oxide thin-film transistors having the double-gate structure as described with reference to FIG. 2.

The pixel circuit of the described embodiment of the present invention is driven similarly to the pixel circuit of the embodiment of the present invention shown in FIG. 1. However, the time for emitting light by the organic light emitting diode EL11 can be controlled by the third transistor T13, which is turned on according to a controlling signal supplied to the first gate C1 through the first controlling signal line EM.

In addition, for adjusting the threshold voltages of the first, second, and third transistors T11, T12, and T13, the controlling signal is supplied to the second gate G2 of the first, second, and third transistors T11, T12, and T13 through the second controlling signal line CONT. The controlling signal can be provided according to the changed levels of the threshold voltages, a passage of time (e.g., elapsed time), and/or a voltage table produced through fixed experiments. By supplying the controlling signal having a fixed voltage level to the second gates G2 of the first, second, and third transistors T11, T12, and T13 through the second controlling signal line CONT, the threshold voltages of the first, second, and third transistors T11, T12, and T13 may be controlled to the required level. Therefore, the threshold voltages of the first, second, and third transistors T11, T12, and T13 are constantly maintained and constant current then flows through the organic light emitting diode EL11, so that a high-gradation expression may be achieved, and deteriorations of image quality and performance can be reduced or prevented.

FIG. 6 is a circuit diagram illustrating a pixel circuit of a flat panel display device according to another embodiment of the present invention. The figure shows the pixel circuit of the organic light emitting display device of another embodiment of the present invention.

Referring to FIG. 6, with respect to the first transistor T21, a first gate G1 is coupled to a first scan line SCAN[n], a drain D is coupled to a data line DATA, and a source S is coupled to a first node N21. With respect to a second transistor T22, a first gate G1 is coupled to a second node N22, and a drain D is coupled to a third node N23. With respect to a third transistor T23, a first gate G1 is coupled to a first controlling signal line EM, a drain D is coupled to a first voltage source ELVDD, and a source S is coupled to the third node N23. With respect to a fourth transistor T24, a first gate G1 is coupled to a second scan line SCAN[n−1] preceding the first scan line SCAN[n], a drain D is coupled to the second node N22, and a source S is coupled to the third node N23. With respect to a fifth transistor T25, a first gate G1 is coupled to the second scan line SCAN[n−1], a drain D is coupled to a reference voltage Vref, and a source S is coupled to the first node N21. A first capacitor C21 is coupled between the source S of the second transistor T22 and the first node N21, and a second capacitor C22 is coupled between the first node N21 and the second node N22. An organic light emitting diode EL21 is coupled between the source of the second transistor T22 and a second voltage source ELVSS. The second gates G2 of the first, second, third, fourth, and fifth transistors T21, T22, T23, T24, and T25 are coupled to a second controlling signal line CONT.

The first, second, third, fourth, and fifth transistors T21, T22, T23, T24, and T25 are oxide thin-film transistors having the double-gate structure as described with reference to FIG. 2.

The pixel circuit of the described embodiment of the present invention is driven similarly to the pixel circuit of the embodiment of the present invention shown in FIG. 5. However, IR drop (e.g., voltage drop) is compensated for by maintaining the first node N21 at the reference voltage Vref, because the fourth and the fifth transistors T24 and T25 are turned on by the scan signal supplied through the second scan line SCAN[n−1], which precedes the first scan line SCAN[n]. The deterioration of luminance and non-uniformity of the organic light emitting diode EL21 can be reduced or prevented by compensating for the threshold voltage of the second transistor 122 by diode-connecting the second transistor T22 when the fourth transistor T24 is turned on.

In addition, when changing the threshold voltages of the first, second, third, fourth, and fifth transistors T21, T22, T23, T24, and T25, the controlling signal is supplied to the second gates G2 of the first, second, third, fourth, and fifth transistors T21, T22, T23, T24, and T25 through the second controlling signal line CONT. The controlling signal can be provided according to the changed level of the threshold voltage, time passes (e.g., elapsed time), and/or a voltage table produced through fixed experiments. By supplying the controlling signal having a fixed voltage level to the second gates G2 of the first, second, third, fourth, and fifth transistors T21, T22, T23, T24, and T25 through the second controlling signal line CONT, the threshold voltages of the first, second, third, fourth, and fifth transistors T21, T22, T23, T24, and T25 may be controlled to the required level. Therefore, the threshold voltages of the first, second, third, fourth, and fifth transistors T21, T22, T23, T24, and T25 are constantly maintained and constant current then flows through the organic light emitting diode EL21 so that a high-gradation expression may be achieved, and deteriorations of image quality and performance can be reduced or prevented.

FIG. 7 is a circuit diagram illustrating a pixel circuit of a flat panel display device according to another embodiment of the present invention. The figure shows the pixel circuit of another embodiment of the present invention as applied to a liquid crystal display (LCD) device.

For a liquid crystal display device, pixels are defined by (e.g., located at) crossing regions of a plurality of scan lines and a plurality of data lines. The pixel circuit for driving each pixel includes a switching circuit for transmitting the data signal to the pixel circuit for driving each pixel, and a capacitor C31 for maintaining the data voltage.

Referring to FIG. 7, with respect to a transistor T31, a first gate G1 is coupled to a scan line SCAN, and a drain D is coupled to a data line DATA. The capacitor C31 and the liquid crystal display (LCD) panel element Clc are coupled in parallel between a source S of the transistor T31 and a common terminal. A second gate G2 of the transistor T31 is coupled to a controlling signal line CONT.

The transistor T31 is an oxide thin-film transistor having the double-gate structure as described with reference to FIG. 2.

First, the scan signal is supplied through the selected scan line SCAN, the data voltage is supplied through the data line DATA, and the transistor T31 transmits the data voltage from the drain D to the source S in response to the scan signal applied to the first gate G1. The capacitor is charged by the data voltage, the liquid crystal display panel element Clc is driven by the charged voltage of the capacitor C31, and the operation time of the liquid crystal display panel element Clc is maintained during one frame by the capacitor C31. The liquid crystal display panel element Clc equivalently represents the liquid crystal display panel having the pixel electrode that is coupled to the source S of the transistor T31 and the common terminal opposite the pixel electrode, and displays an image by being controlled by the light penetration rate corresponding to the arrangement of the liquid crystals.

During the process as mentioned above, for changing a threshold voltage of the transistor T31, a controlling signal is supplied to the second gate G2 of the transistor T31 through the controlling signal line CONT. The controlling signal can be provided according to the changed level of the threshold voltage, a passage of time, and/or a voltage table produced through fixed experiments. By supplying the controlling signal having a fixed voltage level to the second gate G2 of the transistor T31 through the controlling signal line CONT, the threshold voltage of the transistor T31 may be controlled to the required level. Therefore, the threshold voltage of the transistor T31 is constantly maintained and then the operation of the liquid crystal display panel element Clc is constantly maintained, so that deteriorations of image quality and performance can be reduced or prevented.

As set forth above, the examples of the pixel circuit according to embodiments of the present invention as shown in FIGS. 1, 5, 6, and 7 were described. However, if need be, they can be variously modified by coupling the transistor or the capacitor to the pixel circuit, and the embodiments of the present invention are not limited to those embodiments. Further, the structure shown in FIG. 2 is provided as an example only, and other suitable double gate transistor structures may be used, as those skilled in the art would appreciate. In addition, the drain D and the source S of the thin-film transistor T were depicted for the convenience of description, and the embodiments of the present invention are not limited thereto.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A pixel circuit of a flat panel display device, comprising:
   a first transistor having a first gate electrode coupled to a scan line, a second electrode coupled to a data line, a second gate electrode coupled to a controlling signal line, and a first electrode;
   a second transistor having a first gate electrode coupled to the first electrode of the first transistor, a second electrode coupled to a first voltage source, a second gate electrode coupled to the controlling signal line, and a first electrode;
   a capacitor coupled between the first gate electrode of the second transistor and the first electrode of the second transistor; and
   an organic light emitting diode coupled between the first electrode of the second transistor and a second voltage source, wherein each of the first and second transistors further comprises:
  a substrate on which the first gate electrode is located;
  a first insulating layer on the first gate electrode;
  an active layer comprising an oxide semiconductor on the first insulating layer and having at least a portion closer to the substrate than a surface of the first gate electrode facing the active layer; and
  a second insulating layer on and above the active layer, wherein the first electrode and the second electrode are on and above the second insulating layer and coupled with the active layer, and wherein the second gate electrode is directly on the second insulating layer and is located between the first electrode and the second electrode,
wherein the controlling signal line is configured to supply a control signal to constantly maintain threshold voltages of the first and second transistors, and
wherein the second transistor is configured to supply a constant current to the organic light emitting diode in response to the control signal.

2. The pixel circuit of the flat panel display device as claimed in claim 1, wherein the first electrode and the second electrode are coupled to the active layer through respective contact holes in the second insulating layer.

3. The pixel circuit of the flat panel display device as claimed in claim 1, wherein the second gate electrode is overlapped with the first gate electrode.

4. The pixel circuit of the flat panel display device as claimed in claim 1, wherein the oxide semiconductor comprises ZnO.

5. The pixel circuit of the flat panel display device as claimed in claim 4, wherein the oxide semiconductor is doped with at least one ion of Ga, In, Sn, Zr, Hf, or V.

6. The pixel circuit of the flat panel display device as claimed in claim 1, wherein the threshold voltages of the first transistor and the second transistor are controlled by a voltage level of a controlling signal supplied to the controlling signal line.

7. A flat panel display device comprising a plurality of pixel circuits, each pixel circuit of the plurality of pixel circuits being as claimed in claim 1.

8. A method for driving a pixel circuit of a flat panel display device, comprising:
  transmitting a data voltage from a second electrode of a first transistor to a first electrode of the first transistor in response to a scan signal applied to a first gate electrode of the first transistor;
  charging a capacitor with the data voltage;
  driving current corresponding to the data voltage according to a charged potential of the capacitor applied to the first gate electrode of a second transistor, thereby emitting light from an organic light emitting diode using the current corresponding to the data voltage; and
  controlling threshold voltages of the first transistor and the second transistor by measuring at least one of the threshold voltages of the first transistor and the second transistor, producing a controlling signal having a voltage level corresponding to a changed degree of the at least one of the threshold voltages as indicated by the measured at least one of the threshold voltages, and supplying the controlling signal to a second gate electrode of the first transistor and a second gate electrode of the second transistor according to a used time of the display device or when the display device is turned on,
wherein each of the first and second transistors further comprises:
  a substrate on which the first gate electrode is located;
  a first insulating layer on the first gate electrode;
  an active layer comprising an oxide semiconductor on the first insulating layer and having at least a portion closer to the substrate than a surface of the first gate electrode facing the active layer; and
  a second insulating layer on and above the active layer, wherein the first electrode and the second electrode are on and above the second insulating layer and coupled with the active layer, and wherein the second gate electrode is directly on the second insulating layer and is located between the first electrode and the second electrode.

9. The method for driving the pixel circuit of the flat panel display device as claimed in claim 8, wherein the threshold voltages of the first transistor and the second transistor are controlled by a voltage level of the controlling signal.

* * * * *